US010784457B2

(12) United States Patent
Wu et al.

(10) Patent No.: US 10,784,457 B2
(45) Date of Patent: Sep. 22, 2020

(54) FABRICATING METHOD OF QLED DEVICE AND QLED DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Yuanchun Wu, Guangdong (CN); Wei Yuan, Guangdong (CN); Shibo Jiao, Guangdong (CN); Zheng Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 313 days.

(21) Appl. No.: 15/745,036

(22) PCT Filed: Nov. 27, 2017

(86) PCT No.: PCT/CN2017/113075
§ 371 (c)(1),
(2) Date: Jan. 15, 2018

(87) PCT Pub. No.: WO2019/080246
PCT Pub. Date: May 2, 2019

(65) Prior Publication Data
US 2019/0386233 A1 Dec. 19, 2019

(30) Foreign Application Priority Data
Oct. 24, 2017 (CN) .......................... 2017 1 1003248

(51) Int. Cl.
*H01L 51/50* (2006.01)
*H01L 51/56* (2006.01)

(52) U.S. Cl.
CPC ............ *H01L 51/502* (2013.01); *H01L 51/56* (2013.01)

(58) Field of Classification Search
CPC ....... H01L 51/502; H01L 51/56; H01L 33/00; H01L 51/50; H01L 33/005; H01L 33/06; H01L 2251/301
(Continued)

(56) References Cited

U.S. PATENT DOCUMENTS 10,164,205 B2 * 12/2018 Kazlas ................ B82Y 20/00
10,333,090 B2 * 6/2019 Zhou ..................... H01L 51/502
(Continued)

FOREIGN PATENT DOCUMENTS

CN    104650862    5/2015
CN    205177887 U  4/2016
(Continued)

*Primary Examiner* — Alexander O Williams
(74) *Attorney, Agent, or Firm* — Hemisphere Law, PLLC; Zhigang Ma (57) ABSTRACT

The disclosure provides a fabricating method of a QLED device and a QLED device. In the fabricating method of a QLED device, a mixed light-emitting layer is formed by doping a quantum dot material with a second hole transporting material having a valence band energy level between the quantum dot material and the first hole transporting material; a stepped barrier between the first hole transporting material and the doped second hole transporting material is used to enhance the hole injection; simultaneously, the first hole transporting material with a higher valence band energy level can block the electrons on one side of the hole transport layer close to the cathode to weaken the injection of electrons into the mixed light-emitting layer, thereby promoting the balance of carriers in the mixed light-emitting layer, (Continued)

improving the carrier recombination efficiency, and then improving the luminous efficiency and brightness of the QLED device.

9 Claims, 5 Drawing Sheets

(58) Field of Classification Search
USPC .......................................................... 257/13
See application file for complete search history.

(56) References Cited

U.S. PATENT DOCUMENTS

| | | | |
|---|---|---|---|
| 2010/0001256 A1* | 1/2010 | Coe-Sullivan | B82Y 30/00 257/13 |
| 2012/0292594 A1* | 11/2012 | Zhou | H01L 51/4233 257/13 |
| 2015/0287927 A1* | 10/2015 | Okubo | H01L 51/004 257/40 |
| 2018/0013088 A1* | 1/2018 | Zhou | H01L 51/5048 |
| 2018/0327622 A1* | 11/2018 | Pan | C09D 11/033 |
| 2018/0331312 A1* | 11/2018 | Pan | C09D 11/03 |
| 2019/0058135 A1* | 2/2019 | Ma | H01L 51/56 |
| 2019/0081263 A1* | 3/2019 | Park | H01L 51/5056 |
| 2019/0086733 A1* | 3/2019 | Min | H01L 33/502 |
| 2019/0097139 A1* | 3/2019 | Lee | H01L 51/0067 |
| 2019/0097151 A1* | 3/2019 | Lee | H01L 51/56 |
| 2019/0115507 A1* | 4/2019 | Kim | G02B 5/201 |
| 2019/0115556 A1* | 4/2019 | Lee | H01L 51/5206 |
| 2019/0123292 A1* | 4/2019 | Woo | H01L 51/0007 |
| 2019/0131548 A1* | 5/2019 | Lee | C07D 495/04 |
| 2019/0131557 A1* | 5/2019 | Lee | H01L 51/5004 |
| 2019/0157566 A1* | 5/2019 | Ryu | H01L 51/0061 |
| 2019/0163016 A1* | 5/2019 | Kim | G02F 1/133611 |
| 2019/0189869 A1* | 6/2019 | Xiao | H01L 33/56 |
| 2019/0276696 A1* | 9/2019 | Pan | C09D 11/037 |
| 2019/0375956 A1* | 12/2019 | Pan | C09D 11/52 |

FOREIGN PATENT DOCUMENTS

| | | | | |
|---|---|---|---|---|
| CN | 106206973 | | 12/2016 | |
| CN | 106384767 | | 2/2017 | |
| CN | 106384767 A | * | 2/2017 | ............ H01L 33/00 |
| CN | 106997926 | | 8/2017 | |
| KR | 10-2012-0018865 A | | 3/2012 | |

* cited by examiner

FABRICATING METHOD OF QLED DEVICE AND QLED DEVICE

RELATED APPLICATIONS

The present application is a National Phase of International Application Number PCT/CN2017/113075, filed on Nov. 27, 2017, and claims the priority of China Application 201711003248.3, filed on Oct. 24, 2017.

FIELD OF THE DISCLOSURE

The disclosure relates to the field of display technology, and in particular to a fabricating method of a QLED device and a QLED device.

BACKGROUND

The organic light-emitting diode (OLED) display apparatus is recognized by the industry as the most promising display device due to many advantages such as self-luminousness, low driving voltage, high luminous efficiency, short response time, high resolution and contrast, viewing angle nearly 180°, wide temperature range, and capability of achieving the flexible display and large-area panchromatic display.

The principle of light-emitting OLED display devices is that emit light by carrier injection and recombination under an electric field. Specifically, an OLED display device generally adopts an ITO pixel electrode and a metal electrode as an anode and a cathode of the device respectively. Under a certain voltage, electrons and holes are injected from the cathode and the anode into the electron transport layer and the hole transport layer respectively. The electrons and holes migrate to the light-emitting layer through the electron transport layer and the hole transport layer, respectively, and meet in the light-emitting layer to form excitons and excite the light-emitting molecules, which emit visible light through radiation relaxation.

A QD (Quantum Dot) is nanocrystalline particles having a radius less than or close to the radius of the Bohr exciton, the particle size thereof typically between 1-20 nm, also called nanocrystals. Because of the excellent characteristics thereof such as tunable emission wavelength, narrow linewidth emission spectrum, high color purity, broad excitation spectrum, high electron mobility, capability of being used for flexible production, QD is widely concerned about the field of light-emitting display. Researchers at home and abroad have studied the use of quantum dot material for electroluminescence, and fabricated QLED (Quantum Dot Organic Light-emitting Display) based on a method and a device structure similar to OLEDs. Since 1994, the first QLED has been fabricated. After more than 20 years of research, no matter from the quantum dot material synthesis, the device structure optimization to explain the light-emitting mechanism, are gradually formed, and the optimum device performance also continues to improve, the current research hotspots are generally the following:

1. The research on the synthesis of novel quantum dot materials, such as the study of chromium-free materials, the effect of the shell thickness of the core-shell material on the luminous efficiency of quantum dots, and near-ultraviolet light quantum dots.

2. The material modification treating methods, for example, treating the surface of poly(3,4-ethylenedioxythiophene) (PEDOT) with sulfuric acid ($H_2SO_4$) to reduce its hydrophilicity and improve the water-oxygen resistance of the device; another example is doping PEDOT with metal oxide to improve the efficiency of hole injection into the organic layer; and adding metal silver nanoparticles to the hole transport layer (HTL) and the electron transport layer (ETL) layers to enhance the formation efficiency of excitons by utilizing the plasmon resonance effect.

3. Starting from the device structure, using the carrier barrier layer, the composite transmission layer and the inversion structure to promote carrier balance, thereby enhancing emission of the device and increasing the external quantum efficiency (EQE).

4. Studying the mechanism of the device efficiency roll-off under a large electric field, there are generally two theories:

4.1. Under a large voltage, the charge density in quantum dots is larger, the probability of non-radiation process such as Auger recombination is increased, thereby resulting in decreased efficiency.

4.2. Under a high pressure, due to the quantum confinement Stark effect, the decreased luminous efficiency of the quantum dot itself is caused.

The most important factor for the performance of a QLED device is the carrier balance in the quantum dot layer. When there is too much of a carrier in the quantum dot layer, the probability of the non-radiative Auger recombination process is increased, then the injected carrier can not be more efficient light. From the energy level structure analysis of the basic devices, the quantum dot material has a lower valence band energy level, a larger potential barrier for hole injection from the hole transport layer to the light-emitting layer, and a lower barrier for electron injection, which may result in carrier injection imbalance, and therefore, it is very important to solve the problem of hole injection and the problem of excessive electron injection for improving QLED performance.

SUMMARY

The object of the disclosure is to provide a fabricating method of a QLED, forming a mixed light-emitting layer by doping a quantum dot material with a second hole transporting material having a valence band energy level between a valence band energy level of the quantum dot material and a valence band energy level of the first hole transporting material; using a stepped barrier between the first hole transporting material and the doped second hole transporting material enhances hole injection; simultaneously, the first hole transporting material with a higher valence band energy level can block the electrons on one side of the hole transport layer close to the cathode to weaken the injection of electrons into the mixed emitting layer, thereby promoting the balance of carriers in the mixed light-emitting layer, improving the carrier recombination efficiency, and then improving the luminous efficiency and brightness of the QLED device.

Another object of the disclosure is to provide a QLED device, a light-emitting layer thereof is a mixed light-emitting layer formed by doping a quantum dot material with a second hole transporting material having a valence band energy level between a valence band energy level of the quantum dot material and a valence band energy level of the first hole transporting material, a stepped barrier is formed between the hole transporting material and the mixed light-emitting layer to enhance the hole injection, and the first hole transporting material with a higher valence band energy level can block the electrons on one side of the hole transport layer close to the cathode to weaken the electron injection, thereby promoting the balance of carriers in the mixed light-emitting layer, improving the carrier recombination efficiency, and improving the luminous efficiency and brightness.

In order to achieve the object, the disclosure provides a fabricating method of a QLED, including the following steps:

step 1: providing a base substrate, forming an anode on the base substrate;

step 2: forming a hole injection layer on the anode;

step 3: forming a hole transport layer on the hole injection layer, and a material of the hole transport layer is a first hole transporting material;

step 4: forming a mixed light-emitting layer on the hole transport layer, and the mixed light-emitting layer includes a second hole transporting material and a quantum dot material, and a valence band energy level of the second hole transporting material is between a valence band energy level of the first hole transporting material and a valence band energy level of the quantum dot material;

step 5: forming an electron transport layer on the mixed light-emitting layer;

step 6: forming a cathode on the electron transport layer.

A specific method for forming a hole transport layer in step 3 is as follows: forming a first mixed solution by formulating the first hole transporting material with the first organic solvent, spin coating the first mixed solution by a spin coater in a glove box with a water-oxygen content of not more than 10 ppm, and obtaining a hole transport layer after annealing; and the first hole transporting material is TFB.

A specific method for forming a mixed light-emitting layer in the step 4 is as follows: forming a second mixed solution by formulating a quantum dot material with a second organic solvent, forming a third mixed solution by formulating the second hole transporting material with the second organic solvent, and then mixing the second and the third mixed solutions in proportion to obtain a fourth mixed solution, spin coating the fourth mixed solution by a spin coater in a glove box with a water-oxygen content of not more than 10 ppm, and obtaining a mixed light-emitting layer after annealing; and the second hole transporting material is CBP.

The third mixed solution in the fourth mixed solution has a mass fraction of 10%-80%.

The mixed light-emitting layer has a thickness of 20-80 nm.

The disclosure also provides a QLED device including:
a base substrate;
an anode disposed on the base substrate;
a hole injection layer disposed on the anode;
a hole transport layer disposed on the hole injection layer;
a material of the hole transport layer is a first hole transporting material;
a mixed light-emitting layer disposed on the hole transport layer, and the mixed light-emitting layer including a second hole transporting material and a quantum dot material, and a valence band energy level of the second hole transporting material is between a valence band energy level of the first hole transporting material and a valence band energy level of the quantum dot material;
an electron transport layer disposed on the mixed light-emitting layer; and
a cathode disposed on the electron transport layer.

The first hole transporting material is TFB.

The second hole transporting material is CBP.

A mass fraction of the second hole transporting material in the mixed light-emitting layer is of 10%-80%.

The mixed light-emitting layer has a thickness of 20-80 nm.

The disclosure also provides a fabricating method of a QLED, including the following steps:

step 1: providing a base substrate, forming an anode on the base substrate;

step 2: forming a hole injection layer on the anode;

step 3: forming a hole transport layer on the hole injection layer, and a material of the hole transport layer is a first hole transporting material;

step 4: forming a mixed light-emitting layer on the hole transport layer, and the mixed light-emitting layer includes a second hole transporting material and a quantum dot material, and a valence band energy level of the second hole transporting material is between a valence band energy level of the first hole transporting material and a valence band energy level of the quantum dot material;

step 5: forming an electron transport layer on the mixed light-emitting layer;

step 6: forming a cathode on the electron transport layer;

the mixed light-emitting layer has a thickness of 20-80 nm;

the specific method for forming the hole transport layer in the step 3 is as follows: forming a first mixed solution by formulating the first hole transporting material with the first organic solvent, spin coating the first mixed solution by a spin coater in a glove box with a water-oxygen content of not more than 10 ppm, and obtaining a hole transport layer after annealing; and the first hole transporting material is TFB;

a specific method for forming a mixed light-emitting layer in the step 4 is as follows: forming a second mixed solution by formulating a quantum dot material with a second organic solvent, forming a third mixed solution by formulating the second hole transporting material with the second organic solvent, and then mixing the second and the third mixed solutions in proportion to obtain a fourth mixed solution, spin coating the fourth mixed solution by a spin coater in a glove box with a water-oxygen content of not more than 10 ppm, and obtaining a mixed light-emitting layer after annealing; and the second hole transporting material is CBP; and the third mixed solution in the fourth mixed solution has a mass fraction of 10%-80%.

The beneficial effect of the disclosure is that the disclosure provides a fabricating method of a QLED, forming a mixed light-emitting layer by doping a quantum dot material with a second hole transporting material having a valence band energy level between a valence band energy level of the quantum dot material and a valence band energy level of the first hole transporting material; using a stepped barrier between the first hole transporting material and the doped second hole transporting material enhances hole injection; simultaneously, the first hole transporting material with a higher valence band energy level can block the electrons on one side of the hole transport layer close to the cathode to weaken the injection of electrons into the mixed emitting layer, thereby promoting the balance of carriers in the mixed light-emitting layer, improving the carrier recombination efficiency, and then improving the luminous efficiency and brightness of the QLED device. The disclosure provides a QLED device, a light-emitting layer thereof is a mixed light-emitting layer formed by doping a quantum dot material with a second hole transporting material having a valence band energy level between a valence band energy level of the quantum dot material and a valence band energy level of the first hole transporting material, a stepped barrier is formed between the hole transporting material and the mixed light-emitting layer to enhance the injection, and the first hole transporting material with a higher valence band energy level can block the electrons on one side of the hole transport layer close to the cathode to weaken the electron injection, improving the carrier recombination efficiency, and then improving the luminous efficiency and brightness of the QLED device.

BRIEF DESCRIPTION OF THE DRAWINGS

For further understanding of the features and technical contents of the disclosure, reference should be made to the following detailed description and accompanying drawings of the disclosure. However, the drawings are for reference only and are not intended to limit the disclosure.

In the drawings.

DETAILED DESCRIPTION OF PREFERRED EMBODIMENTS

To further illustrate the technical means adopted by the disclosure and the effects thereof, the following describes in detail the preferred embodiments of the disclosure and the accompanying drawings.

Figure 1:
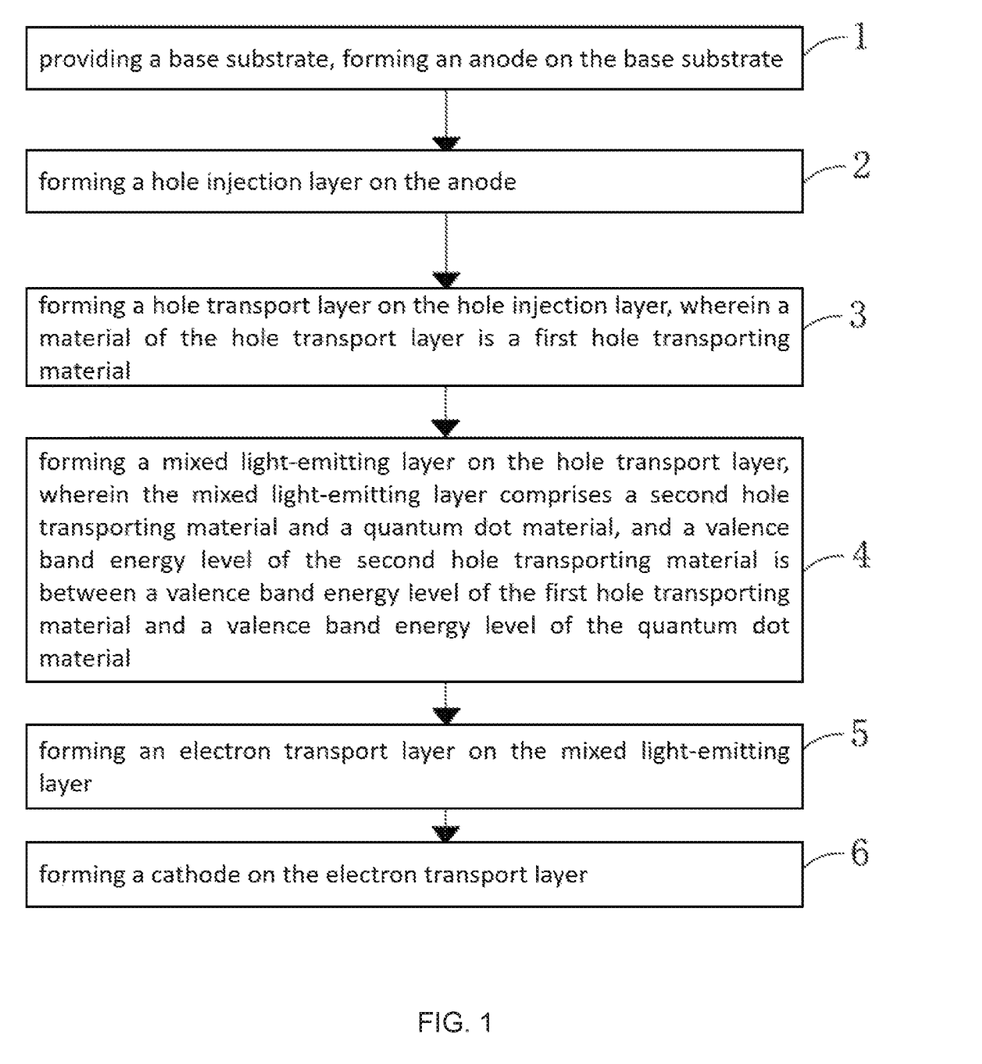
FIG. 1 is a flowchart of a fabricating method of a QLED device of the disclosure.
Figure 2:
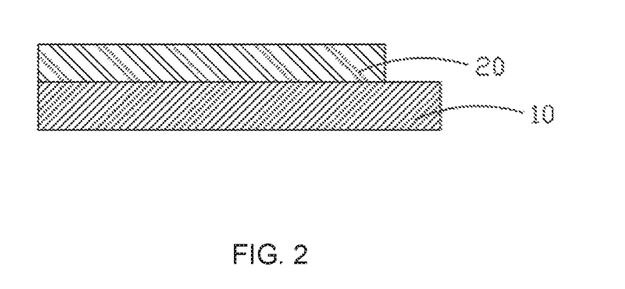
FIG. 2 is a schematic view of step 1 of the fabricating method of the QLED device of the disclosure.

Referring to FIG. 1, in combination with FIGS. 2 to 7, the disclosure provides a fabricating method of a QLED, including the following steps:

In step 1, as shown in FIG. 2, a base substrate 10 is provided, and an anode 20 is formed on the base substrate 10.

Specifically, in step 1, a material of the anode 20 may be selected from a transparent conductive material of indium tin oxide (ITO) or indium zinc oxide (IZO), preferably ITO.

Specifically, in the step 1, the process of improving the work function of the anode 20 is further included to facilitate the injection of holes. Specifically, the base substrate with the anode formed thereon is scrubbed with cotton wool, and then sonicated with deionized water and alcohol for 10-30 min, respectively, and followed by ultraviolet-ozone treatment for 5 to 30 min after being blown dry with nitrogen gas. Preferably, the sonication time is 15 min and the ultraviolet-ozone treatment time is 10 min.

Figure 3:
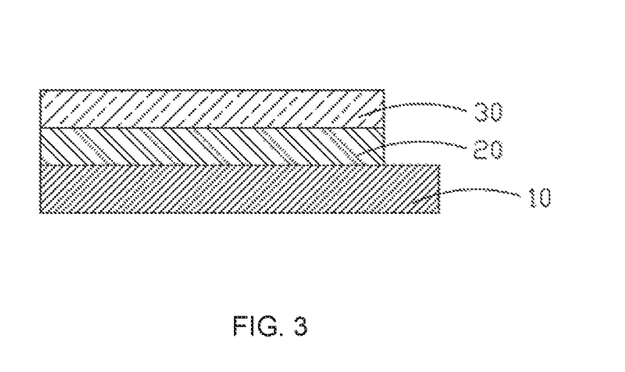
FIG. 3 is a schematic view of step 2 of the fabricating method of the QLED device of the disclosure.

In step 2, as shown in FIG. 3, a hole injection layer 30 is formed on the anode 20.

Specifically, the material of the hole injection layer 30 in step 2 is PEDOT: PSS (poly(3,4-ethylenedioxythiophene) polystyrene sulfonate).

Specifically, the fabricating method of the hole injection layer 30 includes forming a PEDOT: PSS film by coating a PEDOT: PSS solution on the anode 20, and annealing to obtain the hole injection layer 30.

Specifically, PSS: PEDOT film is spin coated by a spin coater, and the speed of the spin coater is 500-5000 rpm, and spin coating time is 30-180 s. Preferably, the speed of the spin coater is 3500 rpm and the spin-on time is 45 s.

Specifically, the annealing temperature is 120-220° C. and the annealing time is 10-30 mi. Preferably, the annealing temperature is 140° C. and the annealing time is 15 min.

Specifically, the hole injection layer 30 has a thickness of 10 to 50 nm, preferably 30 nm.

Figure 4:
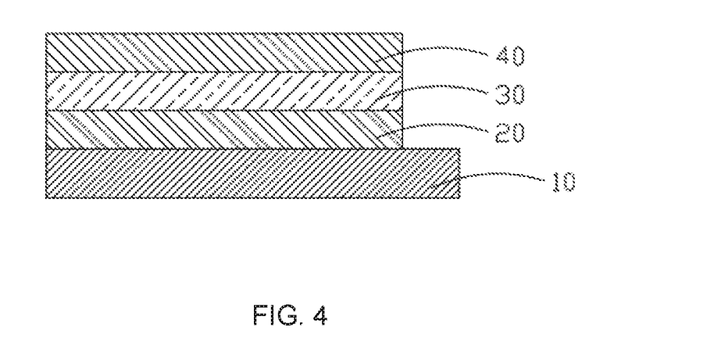
FIG. 4 is a schematic diagram of step 3 of the fabricating method of the QLED device of the disclosure.

In step 3, as shown in FIG. 4, a hole transport layer 40 is formed on the hole injection layer 30, and the material of the hole transport layer 40 is a first hole transporting material.

Specifically, the first hole transporting material may be poly(9,9-dioctylfluorene-co-N-(4-butylphenyl)diphenylamine) (TFB).

Specifically, in step 3, the first hole transporting material and the first organic solvent are formulated to form a first mixed solution, and the first mixed solution is spin-coated with a spin coater in a glove box having a water-oxygen content of not more than 10 ppm, and the hole transport layer 40 is obtained after annealing.

Preferably, the water content of the glove box does not exceed 0.1 ppm.

Specifically, the first organic solvent can be one of chlorobenzene, toluene or ethanol. Preferably, the first organic solvent is chlorobenzene.

Specifically, the spin coater speed is of 500-5000 rpm, the spin coating time is of 30-180 s, the annealing temperature is of 50-120° C. and the annealing time is of 10-30 min. Preferably, the speed of the spin coater is 3000 rpm, the spin-coating time is 60 s, the annealing temperature is 110° C., and the annealing time is 15 min.

Specifically, in the first mixed solution, the concentration of the first hole transporting material is of 5-50 mg/mL, preferably 10 mg/mL.

Specifically, the hole transport layer 40 has a thickness of 20-80 nm, preferably 40 nm.

Figure 5:
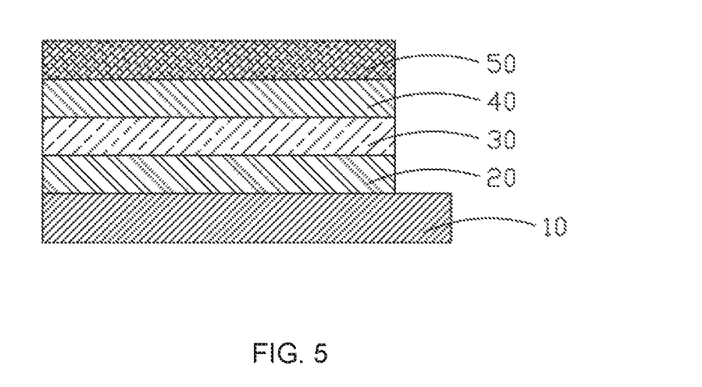
FIG. 5 is a schematic diagram of step 4 of the fabricating method of the QLED device of the disclosure.

In step 4, as shown in FIG. 5, a mixed light-emitting layer 50 is formed on the hole transport layer 40; the mixed light-emitting layer 50 includes a second hole transporting material and a quantum dot material, and the valence band energy level of the second hole transporting material is between the valence band energy level of the first hole transporting material and the valence band energy level of the quantum dot material.

Specifically, the second hole transporting material is (4,4'-N,N'-dicarbazole) biphenyl (CBP).

Specifically, the quantum dot material includes one or more of CdS, CdSe, ZnSe, CdS/ZnS, or CdSe/ZnS.

Specifically, in step 4, the quantum dot material and the second organic solvent are formulated into a second mixed solution, the second hole transporting material and the second organic solvent are formulated into the third mixed solution, and then the second and third mixed solutions are mixed in proportion to obtain the fourth mixed solution; the fourth mixed solution is spin coated by a spin coater in a glove box with a water-oxygen content of not more than 10 ppm, and a mixed light-emitting layer 50 is obtained after annealing. Preferably, the water content of the glove box does not exceed 0.1 ppm.

Specifically, the spin coater speed is of 500-5000 rpm, the spin coating time is of 30-180 s, the annealing temperature is of 50-120° C., and the annealing time is of 10-30 min. Preferably, the speed of the spin coater is 3500 rpm, the spin-coating time is 60 s, the annealing temperature is 60° C., and the annealing time is 20 min.

Specifically, in the second mixed solution, the concentration of the quantum dot material is of 5-50 mg/mL, preferably 10 mg/mL. In the third mixed solution, the concentration of the second hole transporting material is of 5-50 mg/mL, preferably 10 mg/mL.

Specifically, in the fourth mixed solution, the third mixed solution has a mass fraction of 10% to 80%, preferably 50%. The second organic solvent is one of chlorobenzene, toluene or ethanol. Preferably, the second organic solvent is toluene.

Specifically, the mixed light-emitting layer 50 has a thickness of 20 to 80 nm, preferably 40 nm.

Figure 6:
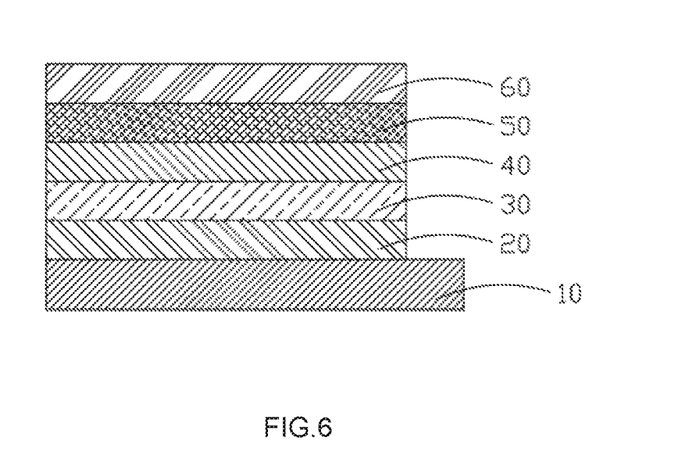
FIG. 6 is a schematic diagram of step 5 of the fabricating method of the QLED device of the disclosure.

In step 5, as shown in FIG. 6, an electron transport layer 60 is formed on the mixed light-emitting layer 50;

Specifically, in step 5, the electron transporting material and the third organic solvent are formulated to form a fifth mixed solution, and the fifth mixed solution is spin-coated by a spin coater in a glove box with a water-oxygen content of no more than 10 ppm and the electron transport layer 60 is obtained after annealing. Preferably, the water content in the glove box does not exceed 0.1 ppm.

Specifically, the third organic solvent is one of chlorobenzene, toluene or ethanol. Preferably, the third organic solvent is ethanol.

Specifically, the spin coater speed is of 500-5000 rpm, the spin coating time is of 30-180 s, the annealing temperature is of 50-120° C., and the annealing time is of 10-30 min. Preferably, the speed of the spin coater is 3500 rpm, the spin-coating time is 80 s, the annealing temperature is 60° C., and the annealing time is 15 min.

Specifically, in the fifth mixed solution, the electron transporting material has a concentration of 5 to 50 mg/mL, preferably 10 mg/mL.

Specifically, the electron transport layer 60 has a thickness of 20-80 nm, preferably 60 nm.

Specifically, the electron transporting material is nanoparticles of ZnO or ZnMgO, and the mass fraction of Mg in the nanoparticles of ZnMgO is 0.5%-10%.

Figure 7:
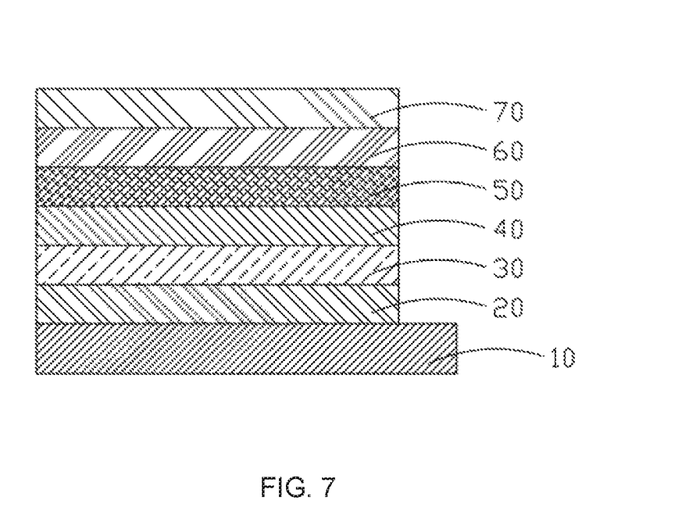
FIG. 7 is a schematic diagram of step 6 of the fabricating method of the QLED device of the disclosure and a schematic structural view of the QLED device of the disclosure.

In step 6, as shown in FIG. 7, a cathode 70 is formed on the electron transport layer 60.

Specifically, in step 6, a cathode 70 is formed by vapor deposition in a vacuum thermal evaporation chamber.

Specifically, the cathode material is one or more of aluminum, magnesium, and silver, preferably aluminum.

Specifically, the thickness of the cathode is 80-200 nm, preferably 100 nm.

Figure 8:
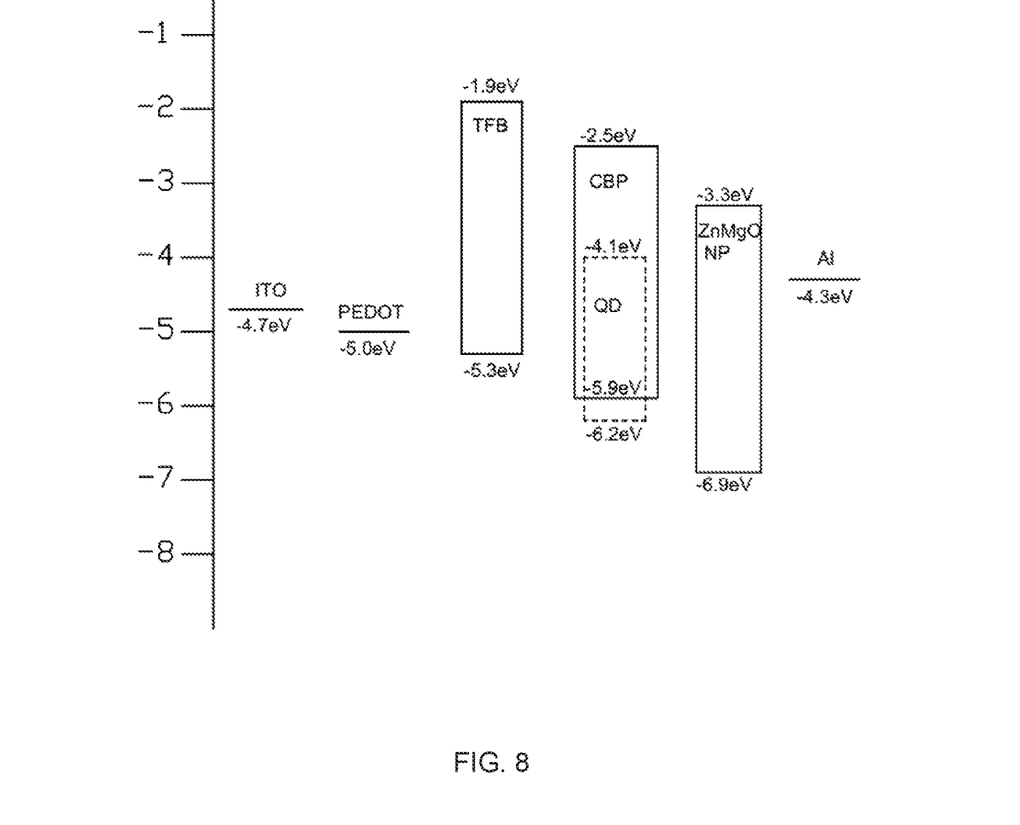
FIG. 8 is a schematic diagram of the energy level of each layer material in the QLED device of the disclosure.

Referring to FIGS. 7 and 8, according to the energy level structure diagram of each layer of material of the QLED structure, the valence band energy level of the quantum dot material QD is lower and is −6.2 eV, the valence band energy level of the first hole transporting material TFB is −5.3 eV, the potential barrier for injecting holes from the hole transport layer 40 to the quantum dot light-emitting layer is larger, and the potential barrier for electrons injected from the cathode side is very low. When the second hole transporting material CBP is doped into the quantum dot light-emitting layer to form the mixed light-emitting layer 50, since the valence band energy level of the second hole transporting material CBP is between the valence band energy level of the quantum dot material QD and the first hole transporting material TFB, and is −5.9 eV, the potential barrier for injecting holes from the hole transport layer 40 to the mixed light-emitting layer 50 is reduced, thereby facilitating the injection of holes into the mixed light-emitting layer 50, and simultaneously, the second hole transporting material CBP is a bipolar transmission material, the electron also has a certain mobility, so the first hole transporting material TFB can have a certain blocking effect on the electrons and block the electrons on one side of the hole transport layer 40 near the cathode 70 to weaken the injection of electrons, thereby promoting the balance of carriers in the mixed light-emitting layer 50, improving the carrier recombination efficiency, and then improving the luminous efficiency and brightness of the QLED device.

Referring to FIG. 7, on the basis of the fabricating method of the QLED device, the disclosure further provides a QLED device, including:

a base substrate 10;

an anode 20 disposed on the base substrate 10, a hole injection layer 30 disposed on the anode 20, a hole transport layer 40 disposed on the hole injection layer 30 r; a material of the hole transport layer 40 is a first hole transporting material;

a mixed light-emitting layer 50 disposed on the hole transport layer 40, the mixed light-emitting layer 50 includes a second hole transporting material and a quantum dot material, and the valence band energy level of the second hole transporting material is between the valence band energy level of the first hole transporting material and the valence band energy level of the quantum dot material;

an electron transport layer 60 disposed on the mixed light-emitting layer 50;

a cathode 70 disposed on the electron transport layer 60.

Specifically, the material of the anode 20 is ITO or IZO, preferably ITO.

Specifically, the material of the hole injection layer 30 is PEDOT: PSS.

Specifically, the hole injection layer 30 has a thickness of 10 to 50 nm, preferably 30 nm.

Specifically, the hole transport layer 40 has a thickness of 20-80 nm, preferably 40 nm.

Specifically, the first hole transporting material is TFB.

Specifically, the second hole transporting material is CBP.

Specifically, in the mixed light-emitting layer 50, the mass fraction of the second hole transporting material is of 10%-80%, preferably 50%.

Specifically, the mixed light-emitting layer 50 has a thickness of 20 to 80 nm, preferably 40 nm.

Specifically, the electron transporting material is nanoparticles of ZnO or ZnMgO, and the mass fraction of Mg in the nanoparticles of ZnMgO is 0.5%-10%.

Specifically, the electron transport layer 60 has a thickness of 20-80 nm, preferably 60 nm.

Specifically, the cathode material 70 is one or more of aluminum, magnesium, and silver, preferably aluminum.

Specifically, the thickness of the cathode 70 is 80-200 nm, preferably 100 nm.

Referring to FIGS. 7 and 8, according to the energy level structure diagram of each layer of material of the QLED structure, the valence band energy level of the quantum dot material QD is lower and is −6.2 eV, the valence band energy level of the first hole transporting material TFB is −5.3 eV, the potential barrier for injecting holes from the hole transport layer 40 to the quantum dot light-emitting layer is larger, and the potential barrier for electrons injected from the cathode side is very low. When the second hole transporting material CBP is doped into the quantum dot light-emitting layer to form the mixed light-emitting layer 50, since the valence band energy level of the second hole transporting material CBP is between the valence band energy level of the quantum dot material QD and the first hole transporting material TFB, and is −5.9 eV, the potential barrier for injecting holes from the hole transport layer 40 to the mixed light-emitting layer 50 is reduced, thereby facilitating the injection of holes into the mixed light-emitting layer 50, and simultaneously, the second hole transporting material CBP is a bipolar transmission material, the electron also has a certain mobility, so the first hole transporting material TFB can have a certain blocking effect on the electrons and block the electrons on one side of the hole transport layer 40 near the cathode 70, thereby promoting the balance of carriers in the mixed light-emitting layer 50, improving the carrier recombination efficiency, and then improving the luminous efficiency and brightness of the QLED device.

To sum up, the method for fabricating the QLED device of the disclosure is realized forming a mixed light-emitting layer by doping a quantum dot material with a second hole transporting material having a valence band energy level between a valence band energy level of the quantum dot material and a valence band energy level of the first hole transporting material; using a stepped barrier between the first hole transporting material and the doped second hole transporting material enhances hole injection; simultaneously, the first hole transporting material with a higher valence band energy level can block the electrons on one side of the hole transport layer close to the cathode to weaken the injection of electrons into the mixed emitting layer, thereby promoting the balance of carriers in the mixed light-emitting layer, improving the carrier recombination efficiency, and then improving the luminous efficiency and brightness of the QLED device. The light-emitting layer of the QLED device of the disclosure uses a quantum dot material to dope the mixed light-emitting layer formed by a second hole transporting material having a valence band energy level between the valence band energy level of the quantum dot material and the valence band energy level of the first hole transporting material, a stepped barrier is formed between the hole transporting material and the mixed light-emitting layer to enhance the injection, and the first hole transporting material with a higher valence band energy level can block the electrons on one side of the hole transport layer close to the cathode to weaken the electron injection, thereby promoting the balance of carriers in the mixed light-emitting layer, improving the carrier recombination efficiency, and then improving the luminous efficiency and brightness of the QLED device.

As described above, it will be apparent to those skilled in the art that various other changes and modifications may be made in accordance with the technical solutions and technical concepts of the disclosure, and all such changes and modifications are subject to be included in the scope of protection of the appended claims, and should not be interpreted as merely limited to the embodiments described herein.

What is claimed is:

1. A fabricating method of a QLED device, comprising following steps:
    step 1: providing a base substrate, forming an anode on the base substrate;
    step 2: forming a hole injection layer on the anode;
    step 3: forming a hole transport layer on the hole injection layer, wherein a material of the hole transport layer is a first hole transporting material;
    step 4: forming a mixed light-emitting layer on the hole transport layer, wherein the mixed light-emitting layer comprises a second hole transporting material being an organic material and a quantum dot material being an inorganic material, and a valence band energy level of the second hole transporting material is between a valence band energy level of the first hole transporting material and a valence band energy level of the quantum dot material;
    step 5: forming an electron transport layer on the mixed light-emitting layer, wherein the electron transport layer is made of nanoparticles;
    step 6: forming a cathode on the electron transport layer;
    wherein a specific method for forming a hole transport layer in step 3 is as follows: forming a first mixed solution by formulating the first hole transporting material with a first organic solvent, spin coating the first mixed solution by a spin coater in a glove box with a water-oxygen content of not more than 10 ppm, and obtaining a hole transport layer after annealing; wherein the first hole transporting material is TFB.

2. The fabricating method of the QLED device according to claim 1, wherein the mixed light-emitting layer has a thickness of 20-80 nm.

3. The fabricating method of the QLED device according to claim 1, wherein a specific method for forming a mixed light-emitting layer in the step 4 is as follows: forming a second mixed solution by formulating a quantum dot material with a second organic solvent, forming a third mixed solution by formulating the second hole transporting material with the second organic solvent, and then mixing the second and the third mixed solutions in proportion to obtain a fourth mixed solution, spin coating the fourth mixed solution by a spin coater in a glove box with a water-oxygen content of not more than 10 ppm, and obtaining the mixed light-emitting layer after annealing; wherein the second hole transporting material is CBP.

4. The fabricating method of the QLED device according to claim 3, wherein the third mixed solution in the fourth mixed solution has a mass fraction of 10%-80%.

5. A QLED device, comprising:
    a base substrate;
    an anode disposed on the base substrate;
    a hole injection layer disposed on the anode;
    a hole transport layer disposed on the hole injection layer; wherein a material of the hole transport layer is a first hole transporting material;
    a mixed light-emitting layer disposed on the hole transport layer, wherein the mixed light-emitting layer comprising a second hole transporting material being an organic material and a quantum dot material being an inorganic material, and a valence band energy level of the second hole transporting material is between a valence band energy level of the first hole transporting material and a valence band energy level of the quantum dot material;
    an electron transport layer disposed on the mixed light-emitting layer; and
    a cathode disposed on the electron transport layer;
    wherein the second hole transporting material is CBP.

6. The QLED device according to claim 5, wherein a mass fraction of the second hole transporting material in the mixed light-emitting layer is of 10%-80%, and the electron transport layer is made of nanoparticles.

7. The QLED device according to claim 5, wherein the mixed light-emitting layer has a thickness of 20-80 nm, and the electron transport layer is made of nanoparticles.

8. The QLED device according to claim 5, wherein the first hole transporting material is TFB.

9. A fabricating method of a QLED device, comprising the following steps:
    step 1: providing a base substrate, forming an anode on the base substrate;

step 2: forming a hole injection layer on the anode;

step 3: forming a hole transport layer on the hole injection layer, wherein a material of the hole transport layer is a first hole transporting material;

step 4: forming a mixed light-emitting layer on the hole transport layer, wherein the mixed light-emitting layer comprises a second hole transporting material and a quantum dot material, and a valence band energy level of the second hole transporting material is between a valence band energy level of the first hole transporting material and a valence band energy level of the quantum dot material;

step 5: forming an electron transport layer on the mixed light-emitting layer;

step 6: forming a cathode on the electron transport layer;

wherein the mixed light-emitting layer has a thickness of 20-80 nm;

wherein a specific method for forming the hole transport layer in the step 3 is as follows: forming a first mixed solution by formulating the first hole transporting material with a first organic solvent, spin coating the first mixed solution by a spin coater in a glove box with a water-oxygen content of not more than 10 ppm, and obtaining a hole transport layer after annealing; wherein the first hole transporting material is TFB;

wherein a specific method for forming the mixed light-emitting layer in the step 4 is as follows: forming a second mixed solution by formulating a quantum dot material with a second organic solvent, forming a third mixed solution by formulating the second hole transporting material with the second organic solvent, and then mixing the second and the third mixed solutions in proportion to obtain a fourth mixed solution, and spin coating the fourth mixed solution by a spin coater in a glove box with a water-oxygen content of not more than 10 ppm, and obtaining the mixed light-emitting layer after annealing; wherein the second hole transporting material is CBP;

wherein the third mixed solution in the fourth mixed solution has a mass fraction of 10%-80%.

\* \* \* \* \*